United States Patent
Stolz et al.

(10) Patent No.: US 10,901,121 B2
(45) Date of Patent: Jan. 26, 2021

(54) PLANARIZATION OF OPTICAL SUBSTRATES

(71) Applicant: Lawrence Livermore National Security, LLC, Livermore, CA (US)

(72) Inventors: Christopher J. Stolz, Lathrop, CA (US); James A. Folta, Livermore, CA (US); Paul B. Mirkarimi, Danville, CA (US); Regina Soufli, Livermore, CA (US); Christopher Charles Walton, Oakland, CA (US); Justin Wolfe, Modesto, CA (US); Carmen Menoni, Fort Collins, CO (US); Dinesh Patel, Fort Collins, CO (US)

(73) Assignees: Lawrence Livermore National Security, LLC, Livermore, CA (US); Colorado State University Research Foundation, Fort Collins, CO (US)

(*) Notice: Subject to any disclaimer, the term of this patent is extended or adjusted under 35 U.S.C. 154(b) by 60 days.

(21) Appl. No.: 16/183,491

(22) Filed: Nov. 7, 2018

(65) Prior Publication Data

US 2019/0162879 A1 May 30, 2019

Related U.S. Application Data

(62) Division of application No. 14/434,699, filed as application No. PCT/US2013/023222 on Jan. 25, 2013, now Pat. No. 10,175,391.

(Continued)

(51) Int. Cl.
   *C23C 14/08* (2006.01)
   *G02B 5/08* (2006.01)
   (Continued)

(52) U.S. Cl.
   CPC ............ *G02B 3/00* (2013.01); *C03C 17/3417* (2013.01); *C23C 14/08* (2013.01); *C23C 14/34* (2013.01);
   (Continued)

(58) Field of Classification Search
   CPC ......... C23C 16/08; C23C 16/34; C23C 14/08; C03C 17/3417; G02B 5/0816
   See application file for complete search history.

(56) References Cited

U.S. PATENT DOCUMENTS

2003/0164998 A1  9/2003  Mirkarimi et al.
2005/0054130 A1  3/2005  Leon et al.
(Continued)

FOREIGN PATENT DOCUMENTS

EP   2906977 B1   6/2018
JP   02192189 A   7/1990
(Continued)

OTHER PUBLICATIONS

Melninkaitis et al; Laser conditioning of high reflectivity mirrors used in OPOs by 266 and 355 nm nanosecond pulses; Laser-Induced Damage in Optical Materials; 2009; Proc. of SPIE vol. 7504; pp. 750408-1 to 750408-6. (Year: 2009).*

(Continued)

*Primary Examiner* — Elizabeth A Burkhart
(74) *Attorney, Agent, or Firm* — Harness, Dickey & Pierce, P.L.C.

(57) ABSTRACT

A method of making a laser mirror in which a mirror substrate has at least a one micron size nodular defect includes depositing a planarization layer over the mirror substrate and the nodular defect, depositing a layer of silicon dioxide over the planarization layer, and etching away a portion of the layer of silicon dioxide. The method also includes thereafter, depositing a layer of hafnium dioxide (Continued)

over the layer of silicon dioxide and repeating the steps of depositing a layer of silicon dioxide, etching away a portion of the layer of silicon dioxide, and depositing a layer of hafnium dioxide until the nodular defect is reduced in size a predetermined amount.

18 Claims, 10 Drawing Sheets

Related U.S. Application Data

(60) Provisional application No. 61/713,332, filed on Oct. 12, 2012.

(51) Int. Cl.
| | | |
|---|---|---|
| *G02B 3/00* | (2006.01) | |
| *C23C 14/34* | (2006.01) | |
| *C03C 17/34* | (2006.01) | |
| *C23F 4/00* | (2006.01) | |

(52) U.S. Cl.
CPC ............ *C23C 14/3442* (2013.01); *C23F 4/00* (2013.01); *G02B 5/0816* (2013.01); *C03C 2218/33* (2013.01); *Y10T 428/265* (2015.01)

(56) References Cited

U.S. PATENT DOCUMENTS

| | | | |
|---|---|---|---|
| 2005/0118533 A1* | 6/2005 | Mirkarimi | B82Y 10/00 430/316 |
| 2007/0126012 A1 | 6/2007 | Omura et al. | |
| 2008/0076268 A1 | 3/2008 | Kraus et al. | |
| 2015/0276993 A1 | 10/2015 | Stolz et al. | |

FOREIGN PATENT DOCUMENTS

| | | | |
|---|---|---|---|
| JP | 06132584 A | | 5/1994 |
| JP | 2000507000 A | | 6/2000 |
| JP | 2000507000 A | | 6/2000 |
| JP | 2002520601 A | | 7/2002 |
| JP | 2002520601 A | | 7/2002 |
| JP | 2007109971 A | | 4/2007 |
| JP | 2011513801 A | | 4/2011 |
| JP | 2011513801 A | | 4/2011 |
| JP | 6329157 | | 4/2018 |
| WO | WO-97/35042 A1 | | 9/1997 |
| WO | WO-00/03400 A1 | | 1/2000 |
| WO | WO 2009/114493 A1 | | 9/2009 |
| WO | 2014058452 A1 | | 4/2014 |

OTHER PUBLICATIONS

Stolz et al; Laser intensification by spherical inclusions embedded within multilayer coatings; Applied OPtics; vol. 45, No. 7; Mar. 1, 2006; pp. 1594-1601. (Year: 2006).*

Xinbin Cheng et al., Using engineered nodules to study laser-induced damage in optical think films with nanosecond pulses, Proc. of SPIE, 2011, vol. 8190, 1-9.

Examiner's Decision of Rejection dated Oct. 1, 2019 in corresponding Japanese Patent Application No. 2018-030700, 4 pp.

JP2018-030700, "Office Action", dated Jan. 7, 2019, 8 pages.

U.S. Appl. No. 14/434,699, "Final Office Action", dated Apr. 5, 2018, 8 pages.

U.S. Appl. No. 14/434,699, "Non-Final Office Action", dated Sep. 26, 2017, 9 pages.

U.S. Appl. No. 14/434,699, "Notice of Allowance", dated Aug. 31, 2018, 9 pages.

U.S. Appl. No. 14/434,699, "Restriction Requirement", dated May 16, 2017, 9 pages.

Cheng, "Using engineered defects to study laser-induced damage in optical thin films with nanosecond pulses", Laser-Induced Damage in Optical Materials, vol. 8190, No. 1, Dec. 15, 2011, pp. 1-9.

Cheng, et al., "Using engineered nodules to study laser-induced damage in optical thin films with nanosecond pulses", Proc. of SPIE, vol. 8190, Nov. 22, 2011, pp. 1-9.

EP13845167.9, "Extended European Search Report", dated Apr. 7, 2016, 11 pages.

EP13845167.9, "Notice of Decision to Grant", dated May 17, 2018, 2 pages.

JP2015-536757, "Examiners Decision of Final Refusal", dated Oct. 23, 2017, 4 pages.

JP2015-536757, "Notice of Decision to Grant", dated Mar. 30, 2018, 3 pages.

JP2015-536757, "Office Action", dated Mar. 17, 2017, 8 pages.

JP2015-536757, "Office Action", dated Oct. 11, 2016, 14 pages.

Langdon, et al., "Influence of process conditions on the optical properties HfO2/SiO2 thin films for high power laser coatings", Proceedings SPIE, vol. 6720, Oct. 10, 2007, pp. 67200X-67200X-8.

PCT/US2013/023222, "International Search Report & Written Opinion", dated Mar. 22, 2013, 13 pages.

Stolz, et al., "High laser-resistant multilayer mirrors by nodular defect planarization [invited]", Applied Optics. Optical Society of America, vol. 53. No. 4, Feb. 1, 2014, pp. A291-A296.

Stolz, et al., "Laser intensification by spherical inclusions embedded within multilayer coatings", Applied Optics. Optical Society of America, vol. 45. No. 7, Mar. 1, 2006, pp. 1594-1601.

Stolz, et al., "Nodular defect planarization for improved multilayer mirror laser resistance", Optical Interference Coating, Jan. 1, 2013, p. FA.1.

\* cited by examiner

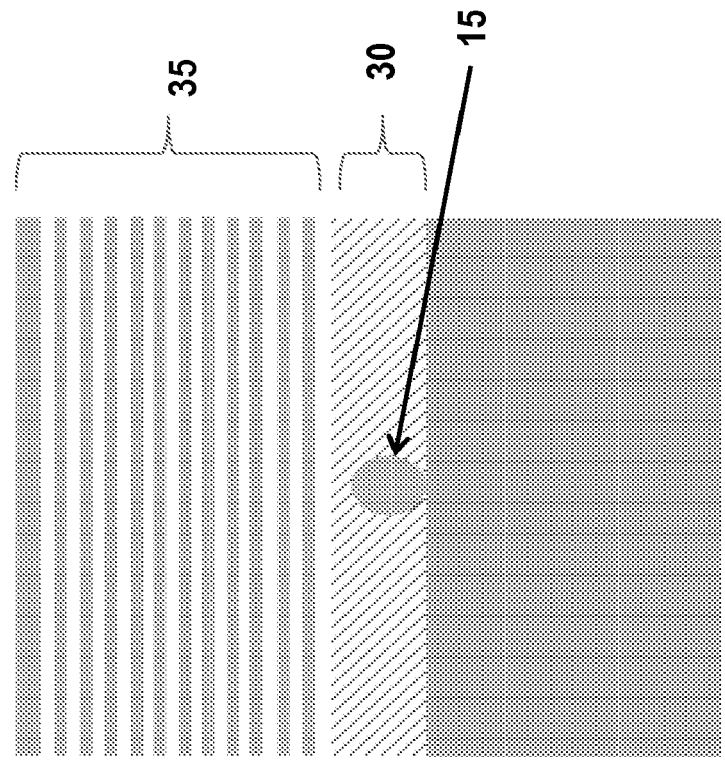
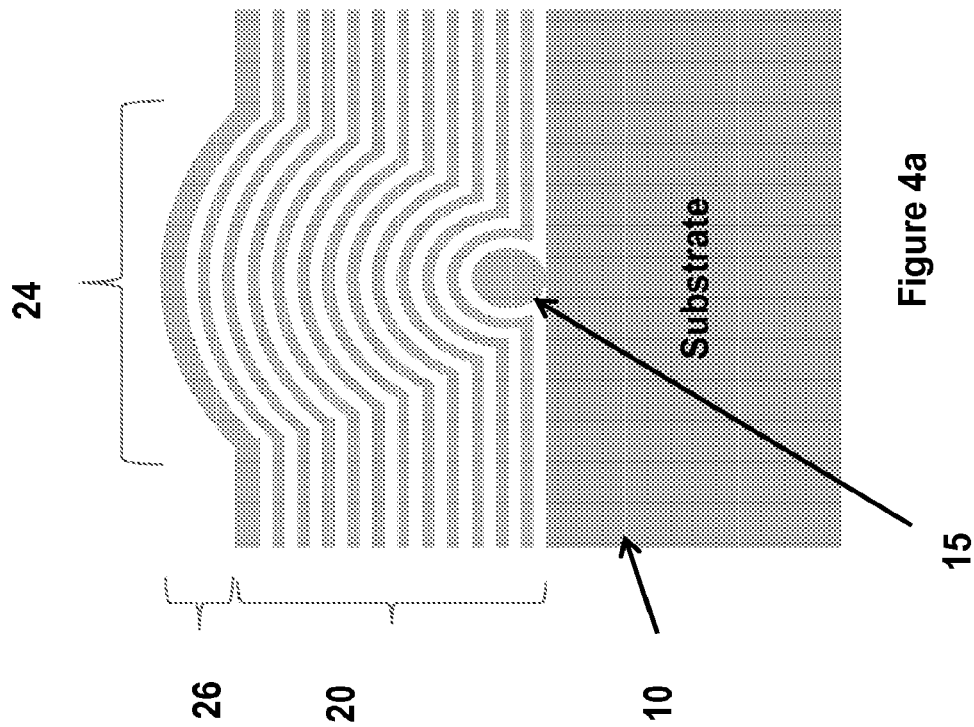
Figure 4a
Figure 4b

PLANARIZATION OF OPTICAL SUBSTRATES

CROSS-REFERENCE TO RELATED APPLICATIONS

This application is a division of U.S. patent application Ser. No. 14/434,699, filed Apr. 9, 2015; which is a National Stage Entry of PCT/US2013/023222, filed Jan. 25, 2013; which claims priority to U.S. Provisional Patent Application No. 61/713,332, filed Oct. 12, 2012, the disclosures of which are hereby incorporated by reference in their entirety and for all purposes.

STATEMENT AS TO RIGHTS TO INVENTIONS MADE UNDER FEDERALLY SPONSORED RESEARCH AND DEVELOPMENT

The United States Government has rights in this invention pursuant to Contract No. DE-AC52-07NA27344 between the United States Department of Energy and Lawrence Livermore National Security, LLC, for the operation of Lawrence Livermore National Laboratory.

BACKGROUND OF THE INVENTION

This invention relates to techniques for the manufacture of large optics, for example, as used in lasers for inertial confinement fusion power plants, and in particular to the manufacture of mirrors for lasers for use in such fusion power plants. The invention, however, generally has applicability to the planarization of optical substrates to overcome defects in such substrates used for laser mirror coatings and defects caused during the coating deposition process.

The National Ignition Facility (NIF) is a laser-based inertial confinement fusion research machine located at the Lawrence Livermore National Laboratory (LLNL) in Livermore, Calif. NIF uses lasers to heat and compress a capsule of deuterium and tritium (DT) fuel to the temperatures and pressures to cause a nuclear fusion reaction. In NIF a bank of 192 lasers fires a hohlraum holding the capsule. The lasers used in NIF are large, extremely powerful lasers, producing beams on the order of a foot square.

Inertial confinement fusion power plants using the technology now being developed at NIF have been proposed. The equipment, systems and support necessary for the deployment of such a fusion power plant are now being investigated and designed at LLNL. In the indirect drive approach to inertial confinement fusion (often "ICF" herein) proposed for such power plants, hohlraums, each with a capsule containing the DT fuel, are injected into a fusion chamber. As they arrive at the center of the chamber, the "targets" are fired upon by a bank of lasers. The hohlraum absorbs and re-radiates the energy of the laser beams striking the inside of the hohlraum as x-rays onto the fuel capsule. This causes the outer surface of the fuel capsule to ablate, compressing and heating the DT fuel to cause a fusion reaction.

The lasers used in such a system operate at high energies with concomitant heat and energy demands imposed on the components of the laser. As such they impose unique design requirements on the optical components within the laser. Of particular concern here is that multilayer optical coatings are laser fluence limited by small inclusions on the substrate or imbedded within the coatings. These inclusions are created by micron-sized particulates on the optical component substrate. The particulates result from imperfect substrate cleaning, contamination during transport of the substrates after cleaning to the coating apparatus, as well as other causes. The geometry of these inclusions and the interference nature of multilayer coatings can lead to extremely high light intensification around the defect, thus causing the defect to have a much lower laser resistance than the surrounding non-defective multilayer coating.

Various approaches have been tried to minimize defects in smaller optical components. In particular, for extreme ultraviolet lithography, small nanometer-sized contaminants are detrimental to the functionality of the resulting masks. A variety of approaches have been tried, some with success in addressing this issue. See, e.g., "A Silicon-Based, Sequential Coat-and-Etch Process to Fabricate Nearly Perfect Substrate Surfaces," Mirkarimi et al., Journal of Nanoscience and Nanotechnology, July, 2005, and "Advancing the ion beam thin-film planarization process for the smoothing of substrate particles," Mirkarimi et al., Microelectronic Engineering 77 (2005) 369-381. Each of these publications describes techniques for mitigating surface imperfections such as pits or particles in the coatings for extreme ultraviolet lithography masks. The approaches described in the articles, however, address defects which are much smaller than those of concern here. For example, the techniques described in these articles address defects on the order of a few tens of nanometers in depth, as opposed to the micron-sized defects problematic with the optical and near infrared coatings. Furthermore, the materials used in the processes described in these articles, primarily silicon, are highly absorbent of energies at the wavelengths of the laser light. As such they cannot be employed for components in which wavelengths in this range are used. Finally, the primary concern addressed in these prior art approaches is one of assuring reflectivity and surface flatness for mask transfer. Here, in contrast, the primary issue relates to energy concentrations around the defects within the coating.

What is needed is a technique for mitigating nodular defects of approximately micron size in a manner to enable use of optical components that include such defects in laser or optical applications.

SUMMARY OF THE INVENTION

The planarization of substrate defects to allow the deposition of a defect-free coatings has applications to high power lasers, both within large laser projects such as at the National Ignition Facility, as well as for components for smaller optics within commercial laser systems. The technology also has potential applications to low roughness coatings for experiments such as the Laser Interferometer Gravitational-Wave Observatory (LIGO) gravity wave detection program.

Optical multilayer coatings are fluence-limited by imbedded nodular (convex) defects. The geometry of these nodular defects, combined with the interference nature of multilayer coatings, leads to light intensification within these defects, thus initiating laser damage, particularly in large optics with high power lasers. To solve this problem, considerable research has addressed the source of the defects. Improvements such as semi-automated cleaning systems, e.g. manual cleaning followed by ultrasonic cleaning, have reduced substrate contamination. Clean rooms have reduced contamination arising from movement of an optical component within a facility, as well as loading of the component into the coating chamber. Load lock systems have also reduced particulates from transport and coating chamber pump-down. Switching from oxide to metallic coating materials has reduced particulates created during deposition processes. Filtration techniques such as velocity filters (rotary vane filters) have also been employed for some deposition processes to reduce particulates arriving on the substrates during deposition. Although substantial improvements have been observed in particle reductions, defects on the substrate still exist, particularly for large aperture (meter class) optical thin films.

Because it is virtually impossible to prevent all defects on such large optical components, this invention focusses not on defect removal, but on defect mitigation. Here the defect is buried within a thick planarization film upon which the multilayer coating is deposited. Alternatively the planarization process can occur during the multilayer coating deposition, ultimately providing a mirror coating with minimal defect-induced light intensification. In one embodiment the multilayer coating is performed by sequential deposition and preferential etching steps. In particular, because ion beam etching is more effective at an angle to the surface, as opposed to perpendicular to the surface, the dome over a defect will etch more efficiently than the surrounding planar coating. By repeated deposition and etching, a multi-layer film can be grown over the defect that effectively buries the defect, and provides a planar top surface. Once the desired magnitude of planarity is achieved, any desired further coatings can be deposited on top of the optic. Because the electric field at the bottom of the multilayer coating is low, the embedded defect will not initiate laser damage.

In a preferred embodiment, a method of making an optical component in which a substrate surface has at least about a one micron size nodular defect includes steps of depositing a planarization layer over the defect; depositing an ion beam etchable layer over the planarization layer; etching away a portion of the ion beam etchable layer; and depositing a layer of a metal oxide over the ion beam etchable layer. Then the steps of depositing an ion beam etchable layer, etching away a portion of the ion beam etchable layer, and depositing a layer of metal oxide are repeated until the nodular defect is reduced in size the desired amount.

In a preferred embodiment, the optical component is a laser mirror; the planarization layer and the ion beam etchable layer each comprise silicon dioxide ($SiO_2$); and the metal oxide comprises hafnium dioxide ($HfO_2$). Also useful as a planarization layer are hafnium dioxide ($HfO_2$), tantala ($Ta_2O_5$) or zirconia ($ZrO_2$). In the preferred embodiment the planarization layer is thicker than the defect. The alternating layers preferably comprise an oxide layer having a high coefficient of refraction which is optically suitable for the expected wavelengths. Also preferably, after deposition, e.g. by ion beam technology, the etchable layer is etched back about half its thickness after each deposition.

BRIEF DESCRIPTION OF THE DRAWINGS

FIGS. 4a-4b illustrate a planarization process for addressing at least about micron-sized defects;

DETAILED DESCRIPTION OF THE INVENTION

Figure 1:
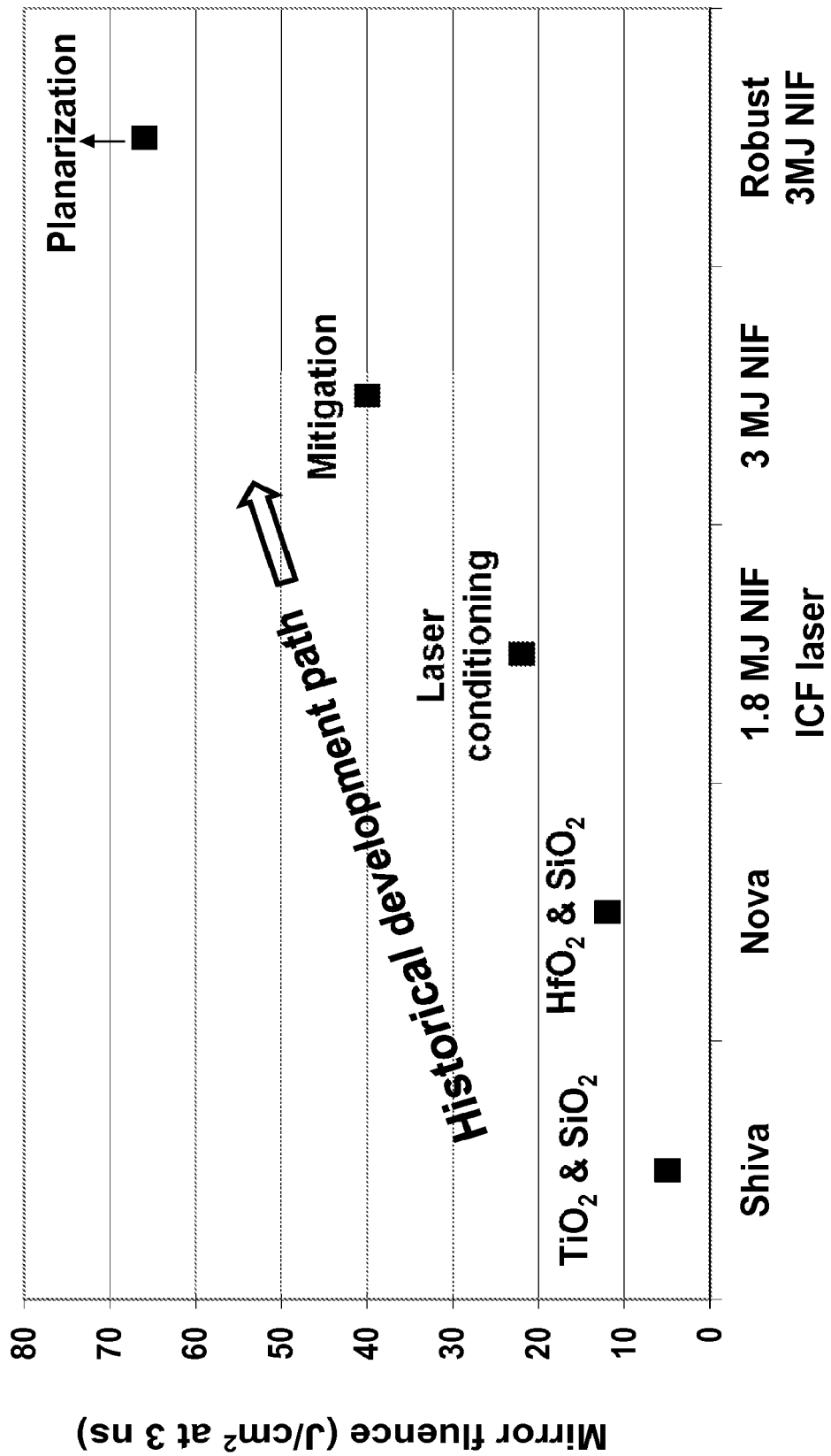
FIG. 1 is a diagram illustrating fluence demands placed upon high-power laser mirrors.

FIG. 1 is a diagram illustrating the increasing demands being placed upon laser mirrors in high-power applications displayed in terms of fluence. Fluence, as discussed here, is the radiative flux integrated over time. On the horizontal axis are various lasers, with corresponding mirror fluence represented on the vertical axis. As shown, mirror fluence rose from about 5 Joules per square centimeter ($J/cm^2$) for the Shiva laser (circa 1977) to 12 $J/cm^2$ for the Nova laser (circa 1984) to 22 $J/cm^2$ for the present 1.8 MJ NIF laser (circa 2009). In future generations of lasers, mirror fluence is expected to be on the order of 65 $J/cm^2$ for a 3 MJ NIF laser. With ICF-based fusion power, it is expected that mirror laser resistance will routinely exceed 100 $J/cm^2$.

Classically laser mirror and optic development has focused upon reducing the number of defects introduced during deposition of coatings, to thereby mitigate laser damage. While this approach has been somewhat successful for small optical components, with large optical components, for example, mirrors on the order of more than a foot square, the approach has been unsuccessful.

Figure 2:
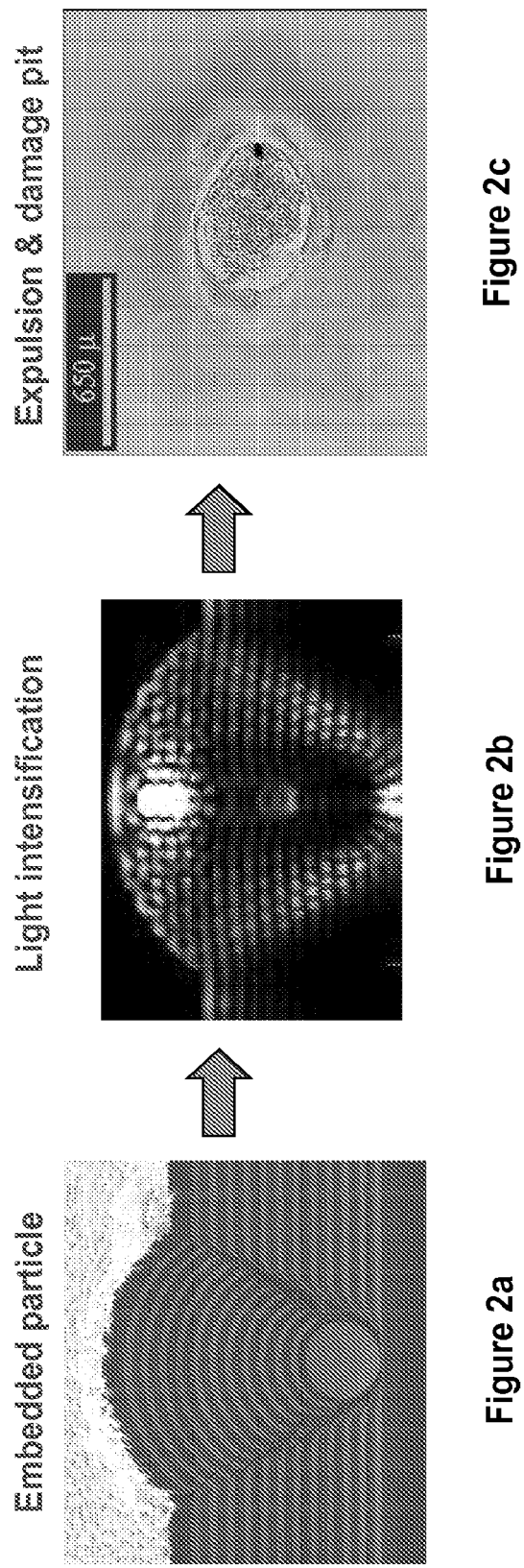
FIGS. 2a-2c illustrate the effect of an embedded micron sized particle.

FIG. 2 is a diagram illustrating the effect of an embedded micron sized particle in the multilayer coating of the laser mirror. To differentiate between these embedded micron sized particles which create a convex defect, and scratches (or pits) which create a concave defect in the coating, we refer to the convex defects as nodules.

As illustrated by FIG. 2a, nodular coating defects on a substrate grow radially in a parabolic manner as a function of film thickness. These nodular defects cause light intensification within multilayer mirror optical coatings as illustrated by FIG. 2b. The result of this light intensification is the laser damage threshold of optical multilayer mirror coatings is reduced by these defects. In particular, when the mirror is subjected to powerful laser light, the resulting heat and energy concentration causes expulsion of the particle and creation of a damage pit, as shown in FIG. 2c.

Figure 3:
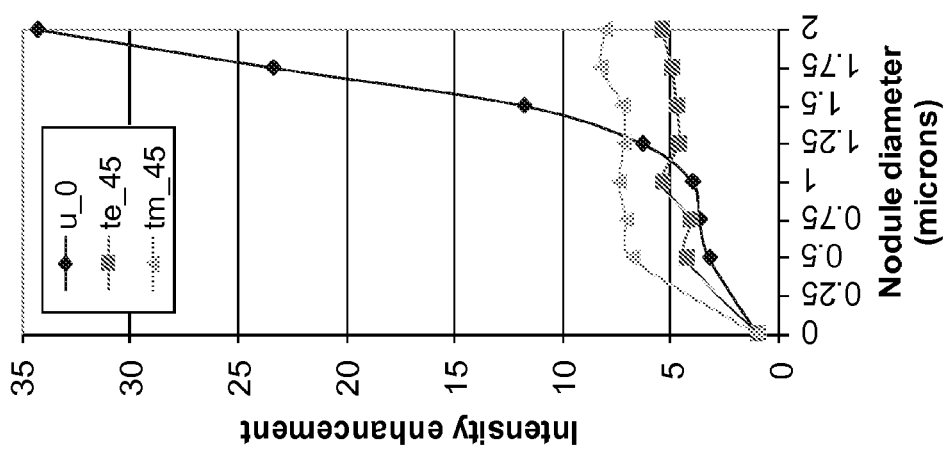
FIG. 3 further illustrates light intensification caused by embedded nodules.

FIG. 3 further illustrates the light intensification caused by embedded nodules as compared to a mirror lacking such embedded nodules. Note almost a factor of 35 intensity enhancement (and thus likely resulting damage) caused by a 2 i.tm diameter nodule. The three cases, u_0, te_45, and tm_45 represent normal (0 degree) incidence, 45 degree incidence at "S" polarization and 45 degree incidence at "P" polarization respectively.

FIGS. 4a illustrates the effect of a micron sized nodule on planarity of a mirror. As shown in FIG. 4a, a substrate 10 has a nodular defect 15 present on its upper surface. A series of layers 20, e.g. a multilayer coating, are illustrated as having been deposited over the surface. The figure illustrates the change in planarity caused by the defect as additional layers are applied. As shown, the additional layers increase the width 24 of the nodule as more and more layers are deposited over it. At the same time the height 26 of the nodule remains essentially constant as the additional layers are deposited.

FIG. 4b illustrates one embodiment of a process according to this invention. As shown, the nodular defect 15 is effectively buried by initial deposition of a planarization layer 30, followed by the sequential deposition of the layers to form a multilayer coating, typically a mirror. In effect, the planarization layer prevents the growth of the nodular defect on the substrate, resulting in a more planar upper surface. The planarizing effect of the process is exaggerated in FIG. 4b, however, actual data from tests performed are presented below.

The choice of materials for the layers illustrated in FIG. 4b is somewhat arbitrary. The planarization layer is preferably a layer that tends to flow around the nodular defect, embedding the defect in the layer. Our preferred material is silicon dioxide ($SiO_2$). Other possible choices for the planarization layer are hafnium dioxide ($HfO_2$), tantala ($Ta_2O_5$) or zirconia ($ZrO_2$).

Above the planarization layer, the alternating layers are preferably silicon dioxide ($SiO_2$) and hafnium dioxide ($HfO_2$). Other materials can be substituted for the silicon dioxide layer provided those materials have the preferential etching characteristics of silicon dioxide, i.e. their surfaces etch more rapidly at an angle to the etching process than if the layers are perpendicular to the etching. Other suitable materials for the high index of refraction layer are other optical oxide materials such as titanium dioxide ($TiO_2$), aluminum oxide ($Al_2O_3$) and niobium oxide ($Nb_2O_5$). More generally, materials which are suitable for use in a multi-layered mirror coating can be used.

In FIG. 4b, the series of layers as described above with combined thickness 35 have been deposited over a nodule. If after deposition of the preferably alternating silicon dioxide layer, that layer is partially etched away, for example, using ion beam etching, a more planar structure results. Note that in FIG. 4b, the differential etching characteristics of an ion beam etch are not illustrated. That effect, however, is shown in FIGS. 5 and 8 below.

Figure 5A:
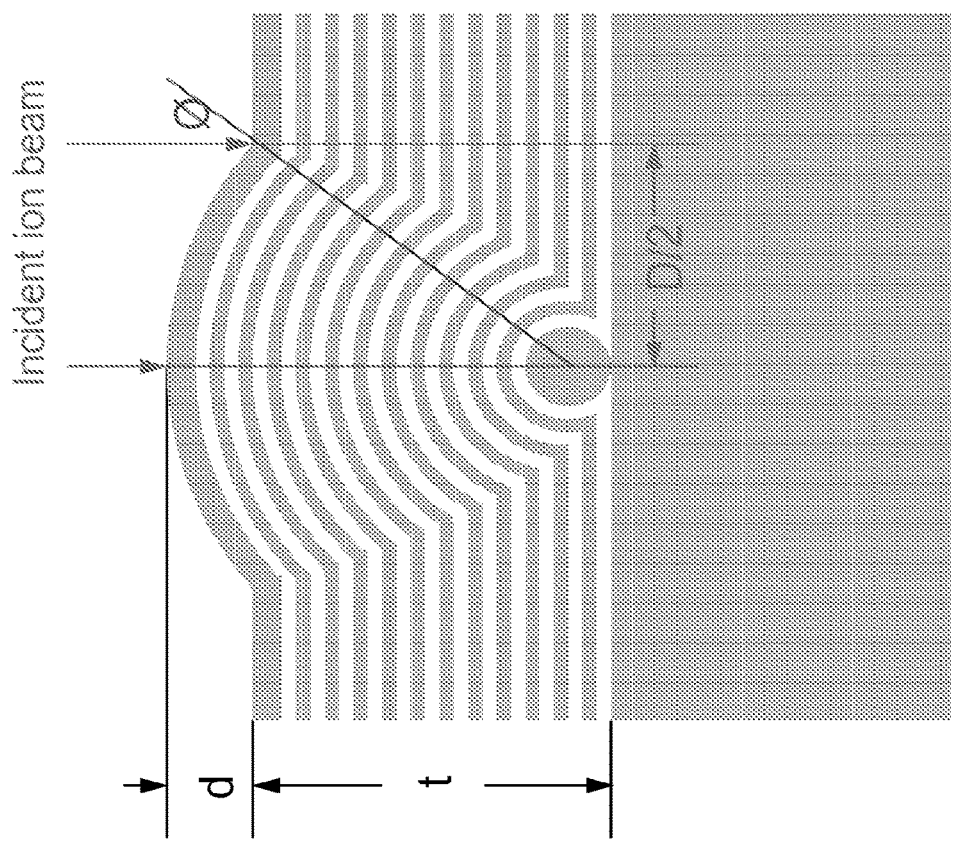
FIGS. 5a-5b illustrate use of a planarization layer.
Figure 5B:
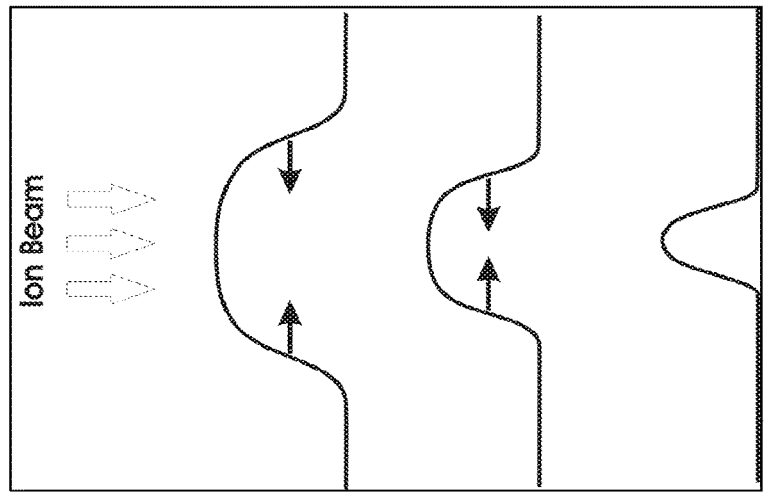

With ion beam etching, the etching rate is dependent upon the angle of the beam with respect to the substrate. The ion beam preferentially attacks the sloped portions of the layers overlying the nodule and etches those faster than the flatter portions surrounding the nodule. The end result is that the defect diameter will gradually collapse as sequential steps of depositing and etching are performed. This effect of preferential etching is illustrated in FIG. 5a. Stated another way, when sputtering a defect such as in FIG. 5a with an ion beam normal to the substrate, the rounded section of the nodular dome (the portion between the center of the dome and the angle 0) etches at a faster rate than the non-defective film surrounding the nodule. A combination of repeated silicon dioxide ($SiO_2$) deposition and ion beam etching causes the nodular defect radius and height to collapse. This effect is shown in FIG. 5b. Note how the defect diameter collapses with the sequential etching steps. After a sufficient number of cycles, the defect will be completely embedded in a thick silicon dioxide layer with a planar surface over the defect. Once this is accomplished, the multilayer mirror is far more planar, or depending on the application, additional layers to make the desired optical component can be deposited over the structure.

Figure 6:
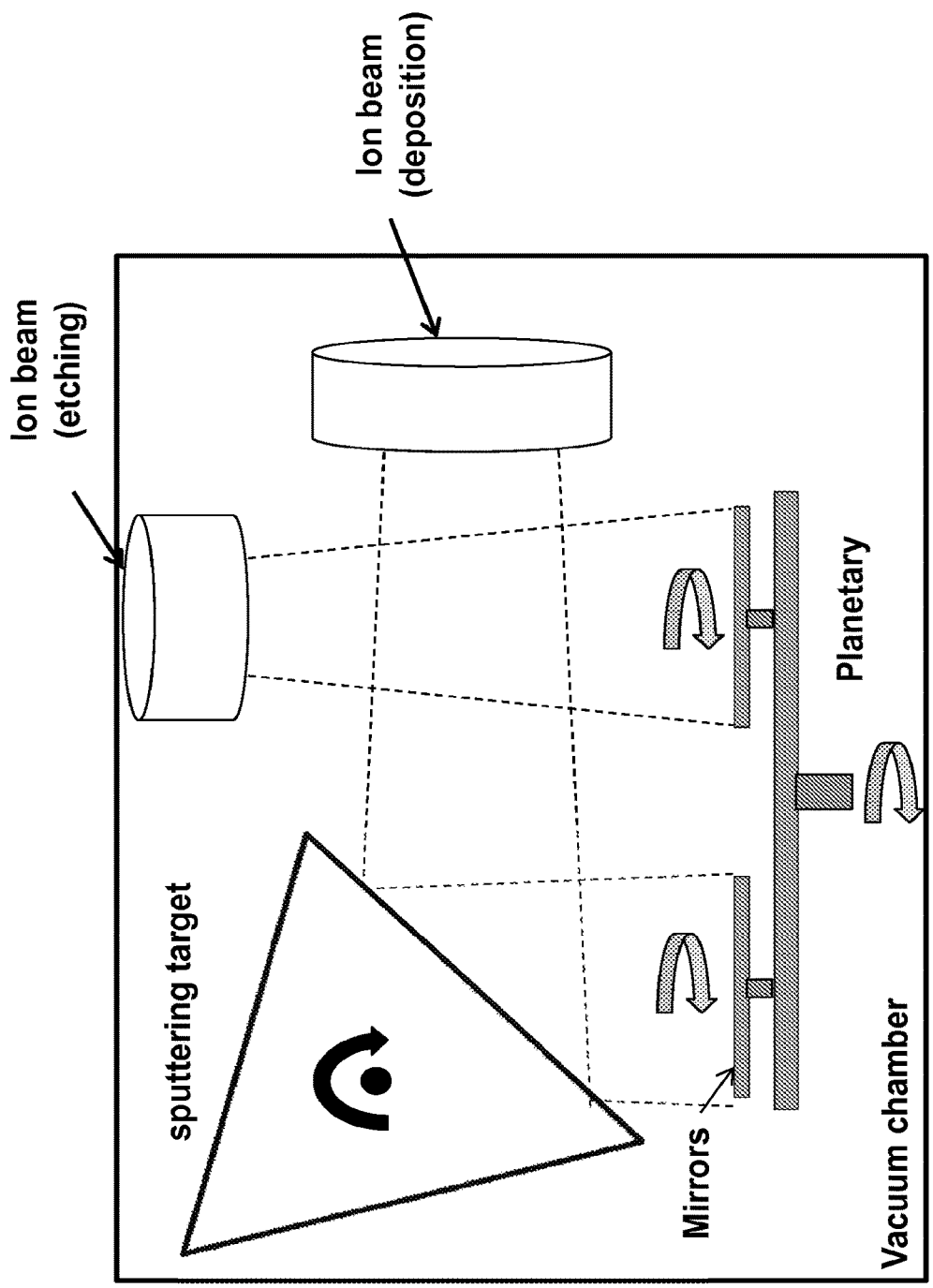
FIG. 6 illustrates deposition and etching equipment.

The process described above, when used to form a laser mirror, is performed using an ion beam sputtering system in a reactive environment with the targets containing the desired material for the layers, preferably silicon and hafnium in an oxygen ambient. FIG. 6 schematically illustrates the equipment used for carrying out these processes. Note that by use of a rotating table in a vacuum chamber, layers may be alternately deposited on the substrates and then partially removed from them—as described above.

Figure 7:
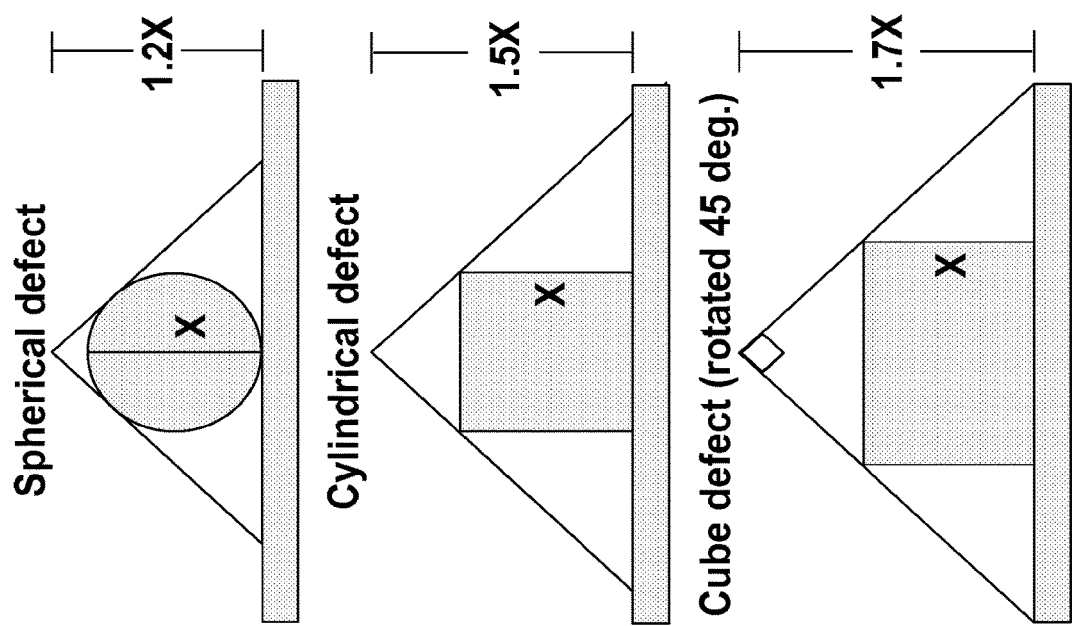
FIG. 7 illustrates determination of planarization layer thickness.

As discussed, prior to deposition of the multilayer coating, a planarization layer is deposited. FIG. 7 illustrates a preferred approach for determination of the initial planarization layer thickness. As shown in FIG. 7, a preferred thickness for the planarization layer is a function of the expected defect size. For spherical defects, a layer 1.2 times the size of the defect will planarize the defect. For cylindrical defect of layer 1.5 times its expected size is sufficient, and for a cube shaped defect, a layer 1.7 times its expected size is appropriate. More generally, this means that a 3 µm thick planarization layer will effectively smooth a 2.5 µm sized spherical defect, a 2 µm sized cylindrical defect, and a 1.76 µm sized cubic defect.

In our preferred embodiment, a planarization layer of appropriate thickness, typically a thick layer of silicon dioxide, is deposited. Other possible choices for the planarization layer are hafnium dioxide ($HfO_2$), tantala ($Ta_2O_5$), or Zirconia ($ZrO_2$). For implementing laser mirrors, the layers disposed on top the planarization layer are preferably alternating layers of silicon dioxide and hafnium dioxide. After each layer of silicon dioxide is deposited, however, approximately half its thickness is etched away. This approach takes advantage of the preferential etching characteristics of ion beam etching, as described above. Thus, for example, if a 2 µm thick layer of silicon dioxide is deposited, preferably about 1 µm of that layer is etched away before the next layer of hafnium dioxide is deposited. Similarly, if 4 µm of silicon dioxide are deposited, then about 2 µm are etched away, etc. After the ion beam etching process, another layer of hafnium dioxide is deposited. Then another layer of silicon dioxide is deposited and etched back. The process is repeated as many times as desired to obtain the necessary planarity of the ultimate surface.

In the preceding explanation of the preferred embodiment, etching away about half of the layer of silicon dioxide is described. It will be appreciated that this is an approximation and that more or less silicon dioxide can be removed from the surface. For example, if the process allows, or if the number of layers is higher, lesser amounts of the silicon dioxide can be removed. Removing smaller amounts, e.g. a quarter of the layer deposited, will typically require more deposition and etching steps, while removing more than half the layer thickness will require fewer steps. Our experiments show satisfactory results if between about 25% and about 75% of the layer thickness is removed.

The inventors here have performed experiments on various size nodules, various thicknesses of planarizing layers and various processes for depositing and removing the overlying mirror layers. In these experiments pillars (or mesas) were intentionally formed on the surface of a substrate, and then those "nodular defects" were subjected to the planarization techniques described here. The results of some of these experiments are illustrated in FIG. 8.

Figures 8A, 8B, 8C, 8D:
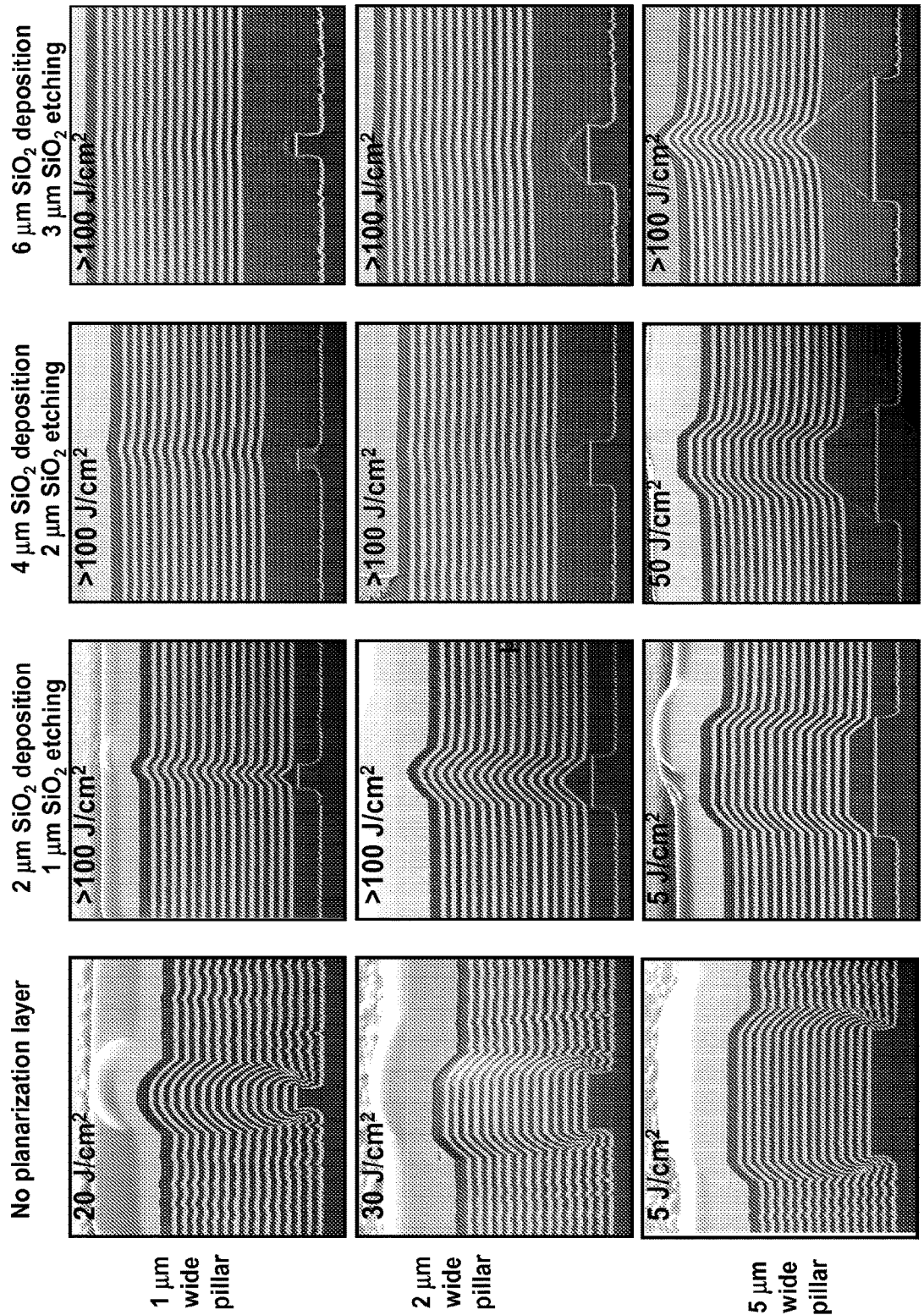
FIGS. 8a-8d illustrate experiments performed on various size nodules and planarizing layers.

FIG. 8a illustrates deposition of a multilayer coating when no planarization layer is used and no etch back is performed. The three illustrations in FIG. 8a show the effect of a 1 µm wide pillar, a 2 µm wide pillar, and a 5 µm wide pillar on planarity of the upper surface of the substrate, with no planarization layer and no etch back. Notice how even minor surface roughness in the substrate propagates through all of the overlying layers of silicon dioxide and hafnium dioxide, and how the defect size increases with the number of layers.

FIG. 8b illustrates our planarization process where an initial planarization layer of silicon dioxide is deposited, and then sequential layers of silicon dioxide and hafnium dioxide are deposited. In this experiment 2 µm thick layers of silicon dioxide were deposited with half that thickness etched away before deposition of the hafnium dioxide layer.

Notice how the defect size is reduced in each of the 2 μm and 5 μm wide defect illustrations. FIGS. 8c and 8d illustrate corresponding experiments with various size defects, different thicknesses of layers and different amounts of etch back. Of particular interest, note that the 1 μm and 2 μm wide pillar defects are almost completely removed by the combination of the thick planarization layer and the repeated deposition and etch back steps. Even the 5um wide pillar is dramatically reduced in its impact on the upper surface, as shown across the bottom row of the photographs in FIG. 8.

FIG. 8 also includes the fluence test results for the structure shown in each photograph. These test results show the laser resistance to the substrate defects. Notice, for example, that the untreated 5 μm wide pillar defect in the lower row of FIG. 8a, when planarized using the techniques described here, exhibits an increase in fluence from about 5 J/cm$^2$ to greater than 100 J/cm$^2$ (See FIG. 8d, lower photo), an improvement of more than a factor of 20.

Figures 9A, 9B:
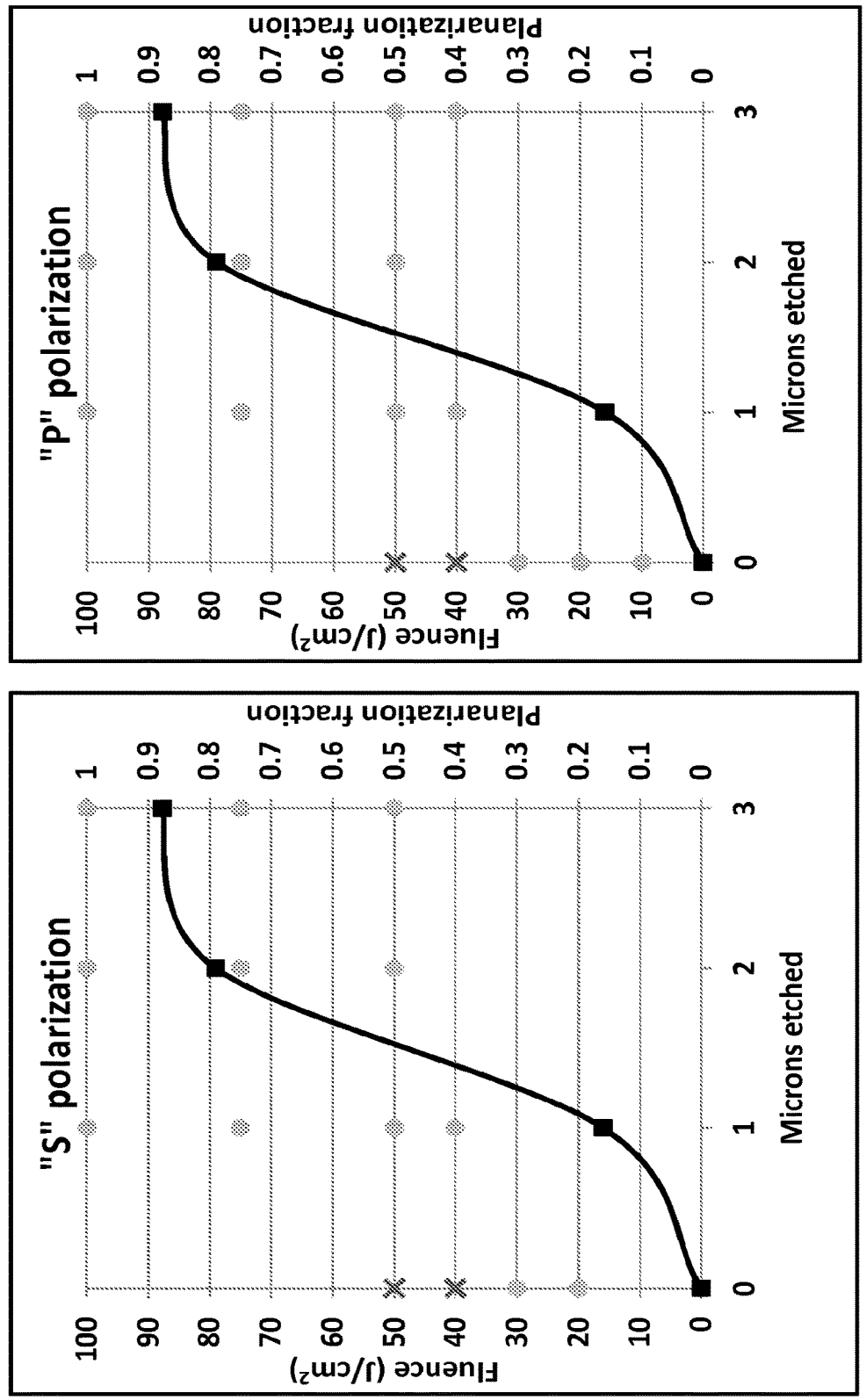
FIGS. 9a-9b and 10a-10b present further experimental results.
Figures 10A, 10B:
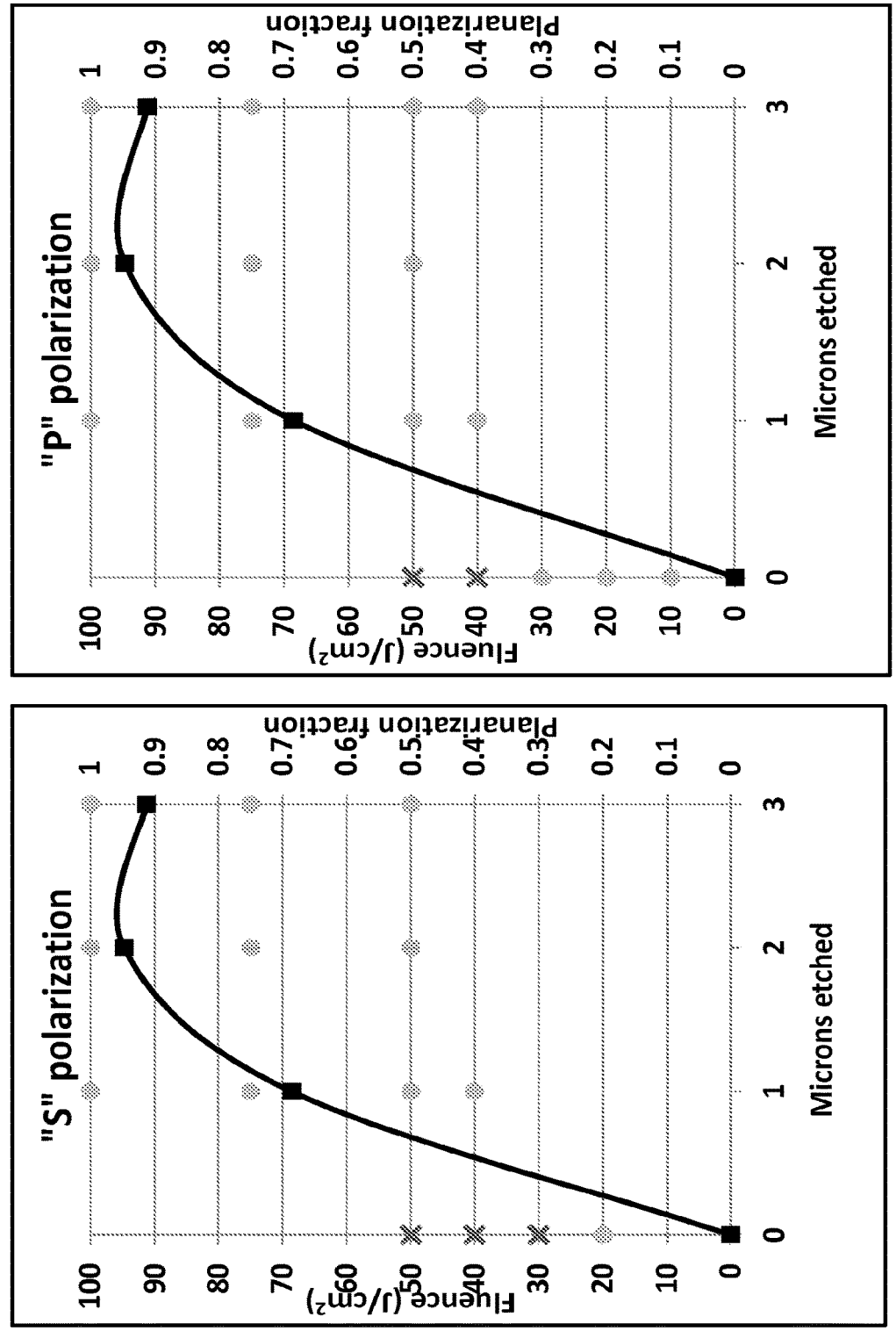

FIG. 9 presents further experimental results. FIG. 9 illustrates results of a laser damage summary for 2 μm wide pillars with 10 ns pulse length and a 1064 nm wavelength laser. FIG. 9a shows results for S polarization, while FIG. 9b shows results for P polarization. Notice that in the circumstance where no planarization is performed, damage occurs at fluences above 40 μm$^2$. Yet with 1 μm, 21 .tm and 3 μm etch back of silicon dioxide layers initially deposited with thickness of 2 μm, 4 μm, and 6 μm respectively, no laser damage occurs, even for fluences of 100 J/cm$^2$. The planarization fraction, is plotted on the right, and shown by the curve in each of FIGS. 9a and 9b. In each of the figures the circular points represent no damage, and the points marked with an "x" represent damage. FIGS. 10a and 10b present similar data for 1 μm pillars. Again note the dramatic increase in tolerance to high laser fluences by virtue of the planarization processes described here.

The foregoing has been a description of preferred embodiments of the invention. It will be appreciated that numerous details, material compositions, and the like, have been provided to explain the invention. The scope of the invention, however, is set forth in the appended claims.

What is claimed is:

1. A method of making a laser mirror in which a mirror substrate has at least a one micron size nodular defect comprising:
    depositing a planarization layer over the mirror substrate and the nodular defect;
    depositing a layer of silicon dioxide over the planarization layer;
    etching away a portion of the layer of silicon dioxide;
    thereafter, depositing a layer of hafnium dioxide over the layer of silicon dioxide; and
    repeating the steps of depositing a layer of silicon dioxide, etching away a portion of the layer of silicon dioxide, and depositing a layer of hafnium dioxide until the nodular defect is reduced in size a predetermined amount.

2. The method of claim 1 wherein depositing a layer of silicon dioxide comprises depositing a layer of controlled thickness.

3. The method of claim 2 wherein etching away a portion of the layer of silicon dioxide comprises etching away about half of a thickness of the layer of silicon dioxide.

4. The method of claim 1 wherein the planarization layer comprises silicon dioxide (SiO$_2$).

5. The method of claim 1 wherein the planarization layer comprises hafnium dioxide (HfO$_2$).

6. The method of claim 1 wherein the planarization layer comprises at least one of tantala (Ta$_2$O$_5$) or zirconia (ZrO$_2$).

7. The method of claim 1 wherein the layer of silicon dioxide is at least one micron thick.

8. The method of claim 1 wherein depositing a layer of silicon dioxide comprises ion beam sputtering silicon dioxide.

9. The method of claim 1 wherein etching away a portion of the layer of silicon dioxide comprises ion beam etching.

10. An optical component comprising:
    a substrate having at least an about one micron size nodule thereon, wherein a surface of the nodule projects above an upper surface of the substrate;
    a planarization layer disposed across the upper surface of the substrate and over the nodule, the planarization layer comprised of a material that flows over and around the nodule to cover the nodule and to produce a new surface layer substantially flat and co-planar with the upper surface of the substrate, without requiring etching to produce the new surface layer; and
    an alternating sequence of layers of silicon dioxide and hafnium dioxide disposed on the planarization layer.

11. The optical component of claim 10 wherein the planarization layer comprises silicon dioxide.

12. The optical component of claim 10 wherein the planarization layer is characterized by a thickness of at least about 1.2 microns.

13. The optical component of claim 12 wherein the thickness is at least about 2 microns.

14. The optical component of claim 10 wherein the silicon dioxide layers comprise sputtered silicon dioxide and the hafnium dioxide layers comprise sputtered hafnium dioxide.

15. The optical component of claim 10 wherein the planarization layer comprises hafnium dioxide (HfO$_2$).

16. The optical component of claim 10 wherein the planarization layer comprises at least one of tantala (Ta$_2$O$_5$) or zirconia (ZrO$_2$).

17. The optical component of claim 10, wherein the optical component comprises a laser mirror.

18. A laser mirror comprising:
    a substrate having at least an about one micron size nodule thereon, wherein a surface of the nodule projects above an upper surface of the substrate;
    a planarization layer disposed over a surface of the substrate and over the nodule, the planarization layer comprised of a material that flows over and around the nodule to fully cover the nodule while producing a new surface layer substantially flat and co-planar with the upper surface, without requiring subsequent etching to produce the new surface layer;
    the planarization layer being formed from a first layer of silicon dioxide; and
    an alternating sequence of additional layers of silicon dioxide and hafnium dioxide disposed on the planarization layer.

* * * * *